(12) United States Patent
Hongo et al.

(10) Patent No.: US 6,904,267 B2
(45) Date of Patent: Jun. 7, 2005

(54) AMPLIFYING DEVICE

(75) Inventors: Naoki Hongo, Tokyo (JP); Yoichi Okubo, Tokyo (JP); Masaki Suto, Tokyo (JP); Tetsuhiko Miyatani, Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 428 days.

(21) Appl. No.: 10/229,010

(22) Filed: Aug. 28, 2002

(65) Prior Publication Data

US 2003/0045247 A1 Mar. 6, 2003

(30) Foreign Application Priority Data

Aug. 30, 2001 (JP) .................................. P. 2001-262116

(51) Int. Cl.[7] .............................................. H04B 1/04
(52) U.S. Cl. .............................. 455/114.3; 455/127.1; 375/297
(58) Field of Search ...................... 455/114.2, 114.3, 455/127.1, 194.2; 375/216, 254, 285, 296, 297; 330/10, 149

(56) References Cited

U.S. PATENT DOCUMENTS

| 5,903,823 | A | * | 5/1999 | Moriyama et al. | ........... 455/126 |
| 6,388,518 | B1 | * | 5/2002 | Miyatani | ................. 330/149 |
| 6,449,466 | B1 | * | 9/2002 | Jin et al. | ................. 455/127.2 |
| 2002/0064236 | A1 | * | 5/2002 | Matsuoka et al. | .......... 375/296 |

FOREIGN PATENT DOCUMENTS

| JP | 08-251246 | 9/1996 |
| JP | 2001-151295 | 5/2000 |
| WO | WO00/39920 | 7/2000 |

* cited by examiner

Primary Examiner—Nguyen T. Vo
Assistant Examiner—Nhan T. Le
(74) Attorney, Agent, or Firm—Jacobson Holman PLLC (57) ABSTRACT

To provide an amplifying device with reduced size, weight and cost. The amplifying device delays input signals using digital delay sections in a main signal system, performs offset rotation processing of digital input signals in carrier offset sections and power detection in a power detecting section in a control system, matches phases of a multi-carrier signal of the main signal system and a power value signal of the control system in a phase control section, and gives distortion compensation in a predistorter for canceling a nonlinear characteristic generated in an amplifier.

18 Claims, 9 Drawing Sheets

AMPLIFYING DEVICE

BACKGROUND OF THE INVENTION

1. Field of the Invention

The present invention relates to a mobile communication system, such as a portable telephone system, and in particular, to an amplifying device for use in a base station device.

2. Description of the Related Art

In the mobile communication system, such as the portable telephone system, a base station device is required to ensure arrival of a radio signal at a mobile station device which is located far from the base station device. Accordingly, it is necessary for the base station device to largely amplify a signal through an amplifier for transmitting it.

In the foregoing mobile communication system, the W-CDMA (Wide-band Code Division Multiple Access) system and so on have been adopted as mobile communication systems.

However, since an amplifier is an analog device, its input-output characteristics form a nonlinear function. Particularly, after exceeding the amplification limit point called a saturation point, the output power remains nearly constant even if the power inputted to the amplifier increases.

This nonlinear output causes nonlinear distortion. In case of a transmission signal before amplification, a signal component outside a desired signal band is suppressed to a low level through a band limiting filter. On the other hand, in case of a signal after passing the amplifier, nonlinear distortion is generated so that a signal component leaks to the exterior of the desired signal band (adjacent channels). This causes a phenomenon that the power spectrum expands to the adjacent channels.

As described above, since the transmission power is high in the base station device, the magnitude of the leak power to the adjacent channels is strictly regulated. Under these circumstances, it has been a large problem how to reduce the foregoing adjacent channel leak power.

For amplifying the transmission power while reducing the adjacent channel leak power, a distortion compensation amplifying device using the predistortion technique has been provided in the base station device for amplifying the transmission power.

The conventional distortion compensation amplifying device using the predistortion technique is described in JP-A-2000-151295 for "DISTORTION COMPENSATION CIRCUIT" published on May 30, 2000 (Applicant: Mitsubishi Electric Corporation; Inventors: Kenichi Horiguchi and others).

In this prior art, a portion of an input signal inputted to a signal path having a vector adjuster, a linearizer and an amplifier and a portion of an output signal outputted from the amplifier are respectively extracted, and a combined power level of these signals is detected, and then, based on a detection result, a bias adjustment of the linearizer and an adjustment of the vector adjuster are carried out so as to minimize the power level.

However, there has been a problem that the foregoing conventional distortion compensation amplifying device is increased in size, weight and cost.

Specifically, analog delay lines used in the conventional distortion compensation amplifying device are large in area and weight and high in cost, and thus exert an influence even on the body of the amplifying device.

SUMMARY OF THE INVENTION

The present invention has been made in view of the above, and has an object to provide an amplifying device with reduced size, weight and cost.

For solving the foregoing problem of the prior art, according to the present invention, there is provided an amplifying device, wherein a digital delay section for digital-delaying an input signal per carrier for a constant time is provided in a main signal system or a control system instead of an analog delay line, phases of signals in the main signal system and the control system are controlled in a phase control section, and a distortion compensating section gives distortion compensation to a multi-carrier signal for canceling a nonlinear characteristic generated in an amplifying section, based on a power value and an output from a distributing section. Therefore, the amplifying device according to the present invention requires no analog delay lines, and thus can be provided with reduced size, weight and cost.

Alternatively, in an amplifying device of the present invention, a digital delay section for digital-delaying an input signal per carrier for a constant time is provided in a main signal system or a control system instead of an analog delay line, phases of signals in the main signal system and the control system are controlled in a phase control section, and a distortion compensating section controls a multi-carrier signal for reducing an error between the demodulated contents of outputs from a coupling section and a distributing section relative to a power value. Therefore, the amplifying device requires no analog delay lines, and thus can be provided with reduced size, weight and cost.

DESCRIPTION OF REFERENCE NUMERALS

101 . . . D/A converter, 102 . . . orthogonal modulator, 103, 126 . . . VCO, 104, 127 . . . mixer, 105 . . . coupler, 107 . . . power detecting section, 109, 109' . . . predistorter, 110 . . . amplifier, 111 . . . distributor, 113 . . . carrier offset section, 114 . . . adding section, 115 . . . up-convert section, 116 . . . phase control section, 117 . . . digital orthogonal modulator, 121-1 . . . attenuation control section, 121-2 . . . phase control section, 122-1, 122-2 . . . D/A converter, 123 . . . attenuator, 124 . . . phasing device, 125, 125' . . . table producing section, 128 . . . LPF, 129 . . . A/D converter, 130-1, 130-2 . . . demodulating section, 131 . . . comparing section

DESCRIPTION OF THE PREFERRED EMBODIMENTS

Preferred embodiments of the present invention will be described hereinbelow with reference to the accompanying drawings.

In an amplifying device according to the embodiment of the present invention, a digital delay section for digital-delaying an input signal per carrier for a constant time is provided in a main signal system or a control system instead of an analog delay line, phases of signals in the main signal system and the control system are controlled in a phase control section, and a distortion compensating section gives distortion compensation to a multi-carrier signal for canceling a nonlinear characteristic generated in an amplifying section, based on a power value and an output from a distributing section. Therefore, the amplifying device according to the embodiment of the present invention requires no analog delay lines, and thus can be provided with reduced size, weight and cost.

Orthogonal modulating sections in claims correspond to analog orthogonal modulators or digital orthogonal modulators, a coupling section to a coupler, an amplifying section to an amplifier, a distributing section to a distributor, and a distortion compensating section to a predistorter.

Figure 1:
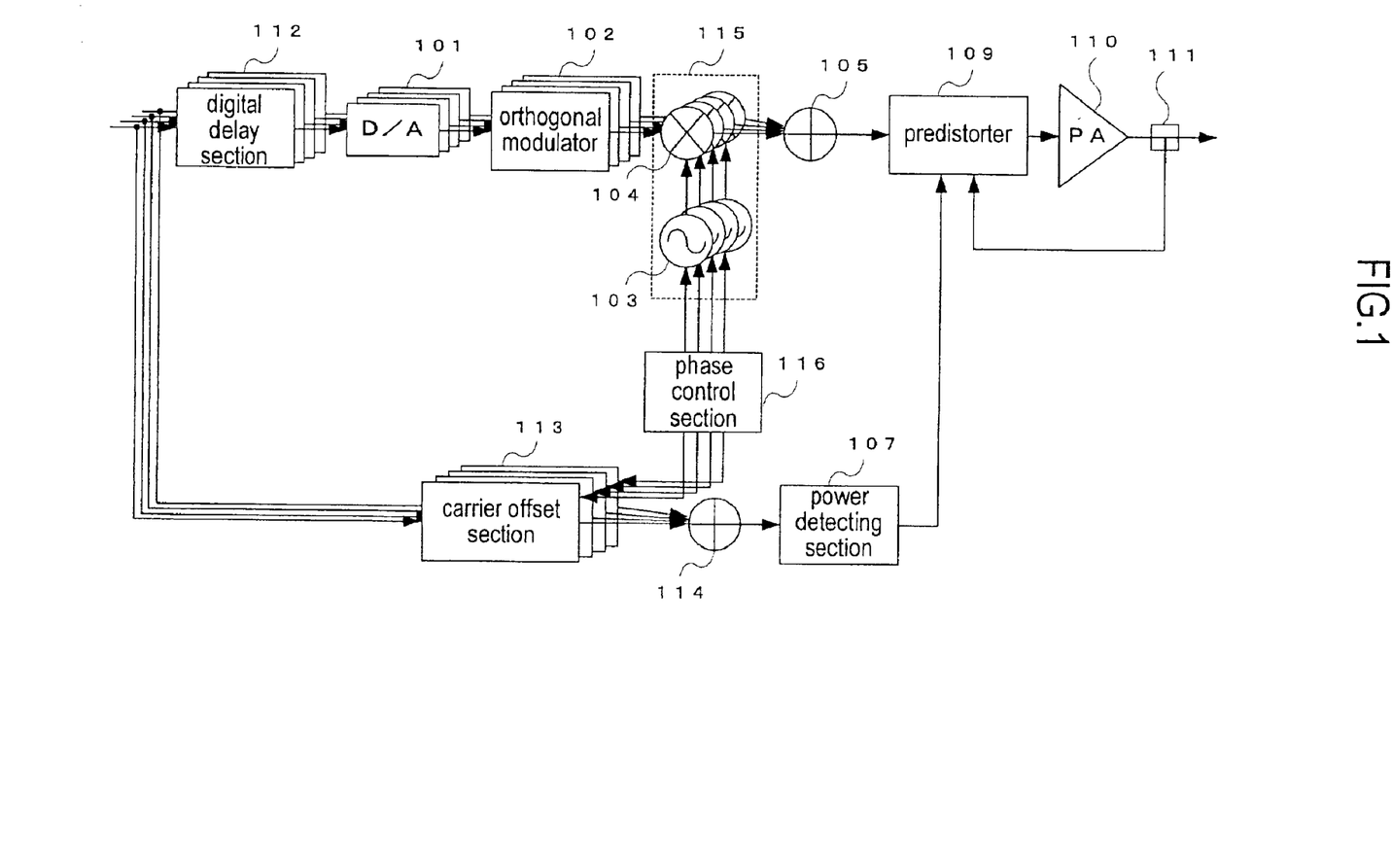
FIG. 1 is a structural block diagram of a distortion compensation amplifying device according to an embodiment of the present invention.

A structure of an amplifying device according to the embodiment of the present invention will be described referring to FIG. 1. FIG. 1 is a first structural block diagram of a distortion compensation amplifying device according to the embodiment of the present invention.

Like the prior art, the amplifying device of FIG. 1 uses the predistortion technique and applies an amplification process to input signals of respective carriers in the form of digital signals. In the distortion compensation amplifying device of FIG. 1, the number of carriers is 4. However, the number of carriers of input signals may be set to a different value.

The amplifying device of FIG. 1 comprises digital delay sections 112, D/A converters (D/A in the figure) 101, orthogonal modulators 102, an up-convert section 115, a coupler 105, carrier offset sections 113, an adding section 114, a power detecting section 107, a phase control section 116, a predistorter 109, an amplifier (PA (Power Amplifier) in the figure) 110 and a distributor 111.

The up-convert section 115 comprises VCOs (Voltage Controlled Oscillators) 103 and mixers 104.

In the amplifying device of FIG. 1, the digital delay section 112, the D/A converter 101, the orthogonal modulator 102, the VCO 103 and the mixer 104 of the up-convert section 115, and the carrier offset section 113 are provided per carrier of the input signal.

Each digital delay section 112 digital-delays the input signal for a constant time and outputs it to the D/A converter 101 of the corresponding carrier. Each digital delay section 112 is constituted using, for example, a memory buffer.

Each D/A converter 101 converts the input signal in the form of the digital signal into an analog signal and outputs it to the orthogonal modulator 102 of the corresponding carrier.

Each orthogonal modulator 102 performs orthogonal modulation of the input signal converted to the analog signal and outputs it to the up-convert section 115.

The up-convert section 115 up-converts the orthogonal-converted input signal to an RF frequency (Radio Frequency) and outputs it to the coupler 105.

In the up-convert section 115, the VCO 103 and the mixer 104 are provided per carrier, and the mixer 104 carries out frequency conversion according to a carrier frequency outputted from the VCO 103, then necessary band limitation is performed using a band limiting filter (not shown) or the like. Further, according to the timing of phase control signals outputted from the phase control section 116, the VCOs 103 output frequencies which differ per carrier.

The coupler 105 combines RF signals of the respective carriers outputted from the up-convert section 115 to produce a multi-carrier signal and outputs it to the predistorter 109.

Each carrier offset section 113 applies offset rotation corresponding to a carrier frequency difference (detuning frequency) to the input signal of the corresponding carrier in the form of digital data and outputs it to the adding section 114.

The carrier offset sections 113 perform offset rotation processing of the respective carriers based on the timing of phase control signals outputted from the phase control section 116. Each carrier offset section 113 may be constituted of, for example, a complex multiplier.

The adding section 114 adds together the input signals of the respective carriers subjected to the offset rotation and outputs it to the power detecting section 107.

The power detecting section 107 detects a power value by calculating the power value based on the summed input signal, and outputs the detected power value to the predistorter 109 as a power value signal.

The phase control section 116 outputs the control signals to the VCOs 103 of the up-convert section 115 and the carrier offset section 113, thereby to control the output timing of the carrier frequencies and the timing of the offset rotation processing of the input signals.

The phase control section 116 may be arranged to use, for example, a clock generator, and output the control signals synchronously with a clock frequency.

The predistorter 109 executes a control of giving a distortion compensation characteristic, relative to the multi-carrier signal inputted from the coupler 105, and outputs it to the PA 110.

The predistorter 109 gives such a distortion compensation characteristic that cancels a nonlinear characteristic generated in the PA 110, based on the power value signal outputted from the power detecting section 107 and the amplified multi-carrier signal outputted from the distributor 111.

The amplifier (PA) 110 amplifies the multi-carrier signal and outputs it.

The distributor 111 carries out distribution of the amplified multi-carrier signal outputted from the amplifier 110 so as to output it to the exterior and feedback it to the predistorter 109.

Figure 2:
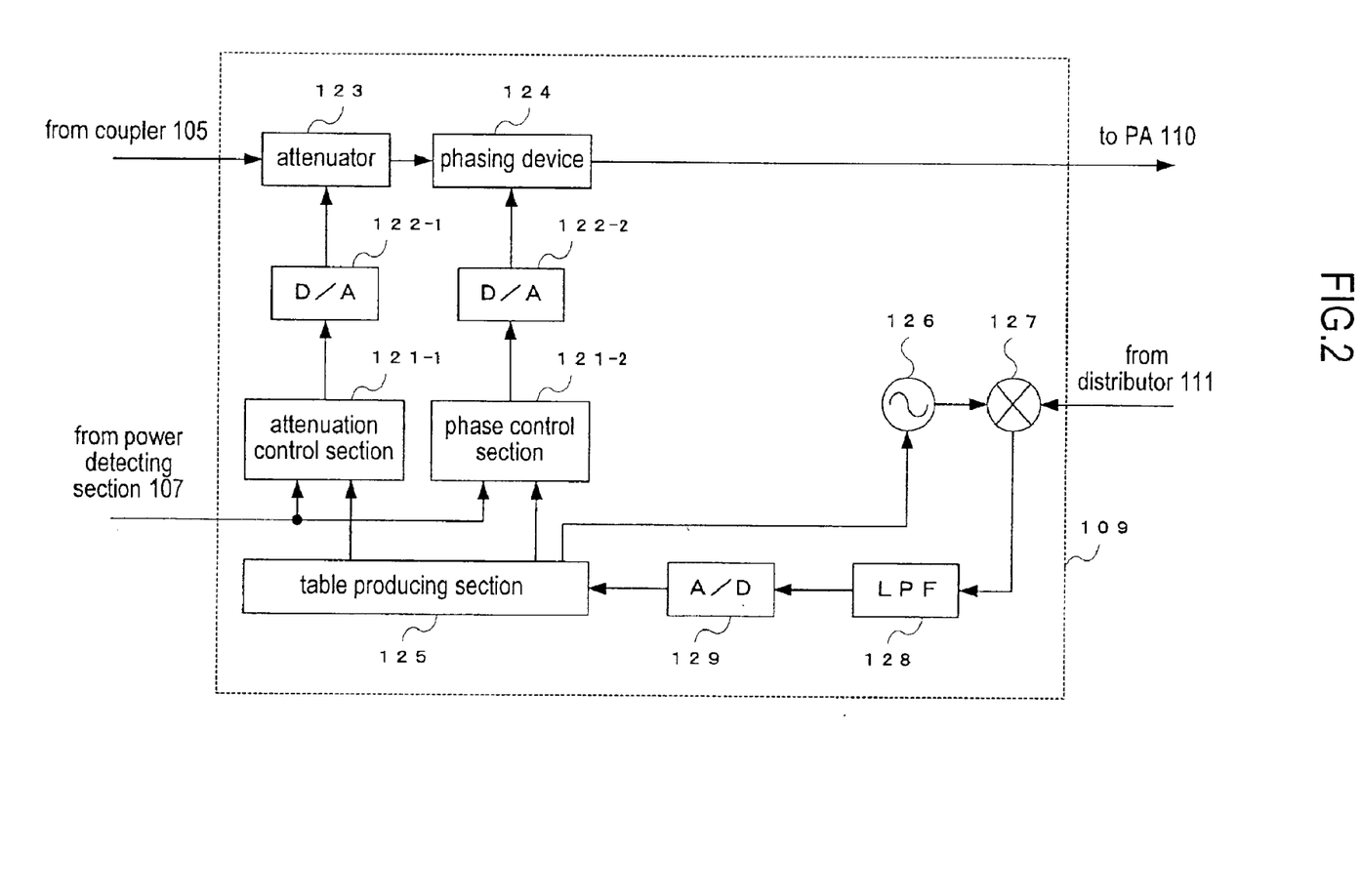
FIG. 2 is a structural block diagram of a predistorter 109.

Now, a structure of the predistorter 109 will be described referring to FIG. 2. FIG. 2 is a structural block diagram of the predistorter 109 in the distortion compensation amplifying device according to the embodiment of the present invention.

The predistorter 109 comprises an attenuation control section 121-1, a phase control section 121-2, D/A converters (D/A in the figure) 122-1 and 122-2, an attenuator 123, a phasing device 124, a table producing section 125, a VCO 126, a mixer 127, an LPF (Low Pass Filter) 128, and an A/D converter (A/D in the figure).

In FIG. 2, the positioning order of the attenuator 123 and the phasing device 124 may be changed.

The attenuation control section 121-1 stores therein an LUT (Look Up Table) showing a relationship between power values and attenuations reflecting distortion compensation characteristics, refers to the LUT based on the inputted power value signal, and outputs an attenuation control signal corresponding to a reference result to the D/A converter 122-1.

Further, based on a control command from the table producing section 125, the attenuation control section 121-1 updates the LUT to adjust attenuations.

The phase control section 121-2 stores therein an LUT showing a relationship between power values and phase control amounts reflecting distortion compensation characteristics, refers to the LUT based on the inputted power value signal, and outputs a phase control signal corresponding to a reference result to the D/A converter 122-2.

Further, based on a control command from the table producing section 125, the phase control section 121-2 updates the LUT to adjust phase control amounts.

The D/A converters 122-1 and 122-2 respectively convert the attenuation control signal outputted from the attenuation control section 121-1 and the phase control signal outputted from the phase control section 121-2 into analog signals, and output them to the attenuator 123 and the phasing device 124.

Based on the attenuation control signal outputted from the attenuation control section 121-1 and analog-converted in the D/A converter 122-1, the attenuator 123 carries out attenuation processing corresponding to a distortion compensation characteristic relative to the inputted multi-carrier signal.

Based on the phase control signal outputted from the phase control section 121-2 and analog-converted in the D/A converter 122-2, the phasing device 124 carries out phase control processing corresponding to a distortion compensation characteristic relative to the inputted multi-carrier signal.

Based on a distortion component extracted from the amplified multi-carrier signal outputted from the amplifier 110 and fed back from the distributor 111, the table producing section 125 outputs the control commands to the attenuation control section 121-1 and the phase control section 121-2 for updating the LUTs stored in the attenuation control section 121-1 and the phase control section 121-2, respectively.

Further, the table producing section 125 outputs a control signal to the VCO 126 for controlling a frequency for distortion component extraction.

In the predistorter of FIG. 2, the table producing section 125 may be constituted using a DSP (Digital Signal Processor) or the like.

Based on the control signal outputted from the table producing section 125, the VCO 126 outputs the frequency for distortion component extraction to the mixer 127.

The mixer 127 performs frequency conversion of the amplified multi-carrier signal fed back from the distributor 111 to convert it to the frequency outputted from the VCO 126.

When the amplified multi-carrier signal subjected to the frequency conversion passes through the LPF 128, the LPF 128 attenuates frequency components above a constant value and extracts a distortion component.

In the predistorter of FIG. 2, a BPF (Band Pass Filter) may be used instead of the LPF 128.

The A/D converter 129 digital-converts the distortion component extracted in the LPF 128, and outputs it to the table producing section 125 as a digital signal.

Now, an operation of the distortion compensation amplifying device according to the embodiment of the present invention will be described referring to FIGS. 1 and 2.

In the amplifying device of FIG. 1, the input signal of each carrier is bifurcated and inputted to the corresponding digital delay section and the corresponding carrier offset section 113.

Hereinafter, in the amplifying device of FIG. 1, a series of circuits from the digital delay sections 112 to the coupler 105 will be referred to as a main signal system, and a series of circuits from the carrier offset sections 113 to the power detecting section 107 will be referred to as a control system.

First, an operation of the main signal system will be described. The input signal of each carrier inputted to the digital delay section 112 is digital-delayed for a constant time, and then, outputted to the D/A converter 101. The digital delay section 112 corresponds to the conventional analog delay line, wherein a delay amount of the input signal is set for matching the timings of the main signal system and the control system in the predistorter 109.

The input signal is converted to the analog signal in the D/A converter 101, then is subjected to the orthogonal modulation in the orthogonal modulator 102. The D/A converter 101 and the orthogonal modulator 102 are also provided per carrier, and perform the foregoing processing relative to the input signal of the corresponding carrier.

The input signal of each carrier subjected to the orthogonal modulation is inputted to the up-convert section 115.

In the up-convert section 115, the VCO 103 and the mixer 104 are provided in pair per carrier. The input signal of each carrier is converted by the corresponding mixer 104 to the carrier frequency outputted from the VCO 103 forming the pair, thereby to be up-converted to the RF frequency.

The input signals of the respective carriers up-converted in the up-convert section 115 are inputted to the coupler 105. The input signals inputted to the coupler 105 are combined and outputted to the predistorter 109 as a multi-carrier signal.

Now, an operation of the control system will be described.

The input signal of each carrier inputted to the carrier offset section 113 is subjected to the offset rotation processing corresponding to a carrier frequency difference.

For example, when the carrier frequencies of the respective carriers are 2000 MHz, 2005 MHz, 2010 MHz and 2015 MHz, the carrier offset sections 113 corresponding to the respective carriers apply offset rotation of 0 MHz, 5 MHz, 10 MHz and 15 MHz to the input signals. Specifically, in the carrier offset sections 113, the offset rotation processing is executed for the input signals so that the carrier frequencies of the respective carriers become equal to each other after the offset rotation processing.

The input signals of the respective carriers subjected to the offset rotation processing are outputted to the adding section 114 where they are added together, and then outputted to the power detecting section 107. The power detecting section 107 detects a power value by calculating the power value based on the summed input signal. The power detecting section 107 outputs the detected power value to the predistorter 109 as a power value signal.

In the power detecting section 107, assuming that a voltage of an in-phase component of the input signal is I and a voltage of a quadrature component thereof is Q, the power can be derived by calculating $I^2+Q^2$.

The multi-carrier signal outputted from the coupler 195 of the main signal system and the power value signal outputted from the power detecting section 107 of the control system are inputted to the predistorter 109. Based on the inputted power value signal, the predistorter 109 executes a control of giving a distortion compensation characteristic to the multi-carrier signal.

In the amplifying device of FIG. 1, for coping with the power detection through the digital processing, the circuit is bifurcated to the main signal system and the control system, wherein the generation of the multi-carrier signal based on the analog input signal in the main signal system and the detection of the power value using the digital input signal in the control system are carried out independently of each other. In the amplifying device of FIG. 1, the phase control section 116 is provided for ensuring synchronization in phase between these two different systems upon the conversion of the input signals to the carrier frequencies.

Upon executing the control of accurately giving the distortion compensation characteristic, it is necessary for the predistorter 109 that the output phase of the carrier frequency and the phase for giving the offset rotation agree with each other. Accordingly, in the amplifying device of FIG. 1, the phase control section 116 outputs the control signals to the VCOs 103 of the up-convert section 115 and the carrier offset sections 13 and, synchronously with the timing of the control signals, the VCOs 103 perform the control of outputting the carrier frequencies and the carrier offset sections 113 perform the control of executing the offset rotation processing. With this arrangement, the phases of the foregoing two processings can be matched with each other, so that the predistorter 109 can give the distortion compensation characteristic based on the accurate power value of the multi-carrier signal.

Hereinbelow, an operation of the predistorter 109 will be described referring to FIG. 2. As shown in FIG. 2, in the predistorter 109, the power value signal is inputted to the attenuation control section 121-1 and the phase control section 121-2. The attenuation control section 121-1 and the phase control section 121-2 respectively store the LUT showing the relationship between power values and attenuations and the LUT showing the relationship between power values and phase control amounts. In each control section, the attenuation or phase control amount reflecting the distortion compensation characteristic can be specified by referring to the LUT based on the power value.

In the attenuation control section 121-1, when the LUT is referred to based on the inputted power value to specify the corresponding attenuation, the attenuation is outputted to the D/A converter 122-1 as the attenuation control signal. In the D/A converter 122-1, the attenuation control signal is analog-converted and outputted to the attenuator 123. In the attenuator 123, based on the inputted attenuation control signal, the attenuation processing of the multi-carrier signal reflecting the distortion compensation characteristic is carried out.

In the phase control section 121-2, when the LUT is referred to based on the inputted power value to specify the corresponding phase control amount, the phase control amount is outputted to the D/A converter 122-2 as the phase control signal. In the D/A converter 122-2, the phase control signal is analog-converted and outputted to the phasing device 124. In the phasing device 124, based on the inputted phase control signal, the phase control processing of the multi-carrier signal reflecting the distortion compensation characteristic is carried out.

The multi-carrier signal, given the distortion compensation characteristic through the attenuation processing and the phase control processing, is outputted to the amplifier 110. The amplifier 110 amplifies the inputted multi-carrier signal and outputs it to the exterior. Since the multi-carrier signal is given the distortion compensation characteristic having an inverse characteristic of the nonlinear characteristic generated in the amplifier 110, the multi-carrier signal is theoretically amplified without distortion.

The amplified multi-carrier signal is, other than outputted to the exterior, also fed back to the predistorter 109 from the distributor 111.

The nonlinear characteristic of the amplifier 110 changes due to aged deterioration, temperature characteristics or the like, so that there arises a case where the distortion can not be compensated by the distortion compensation characteristic given in the predistorter 109. Accordingly, the predistorter 109 carries out adaptive predistortion wherein a distortion component remaining without compensation is extracted from the fed-back amplified multi-carrier signal, and the distortion compensation characteristic is corrected based on the extracted distortion component so as to be adapted to a change of the nonlinear characteristic.

The amplified multi-carrier signal fed back from the distributor 111 is inputted to the mixer 127 in the predistorter 109. The mixer 127 performs frequency conversion of the inputted signal to convert it to the frequency outputted from the VCO 126, and outputs it to the LPF 128. With respect to the multi-carrier signal subjected to the frequency conversion, the LPF 128 attenuates frequency components above a constant frequency, thereby to extract a distortion component. The extracted distortion component is inputted to the A/D converter 129 as a distortion component signal so as to be digital-converted.

The digital-converted distortion component signal is inputted to the table producing section 125. Based on the inputted distortion component signal, the table producing section 125 outputs the control commands to the attenuation control section 121-1 and the phase control section 121-2 for updating the LUTs stored in the respective control sections so as to minimize the distortion component.

The attenuation control section 121-1 and the phase control section 121-2 respectively update the LUTs based on the inputted control commands to adjust the attenuations and the phase control amounts. Thereafter, in the respective control sections, the attenuation processing and the phase control processing of the multi-carrier signal are performed based on the updated LUTs, so that the distortion compensation characteristic adapted to the change of the nonlinear characteristic can be given.

The table producing section 125 outputs the control signal to the VCO 126. According to the control signal, the VCO 126 updates the frequency for the distortion component extraction.

The predistorter 109 of FIG. 2 performs the adaptive predistortion for extracting the distortion component. As other adaptive predistortion, the table producing section 125 may demodulate the fed-back amplified multi-carrier signal and compare it with the multi-carrier signal outputted from the coupler 105, and then, update the LUTs of the attenuation control section 121-1 and the phase control section 121-2 so as to minimize an error.

Figure 3:
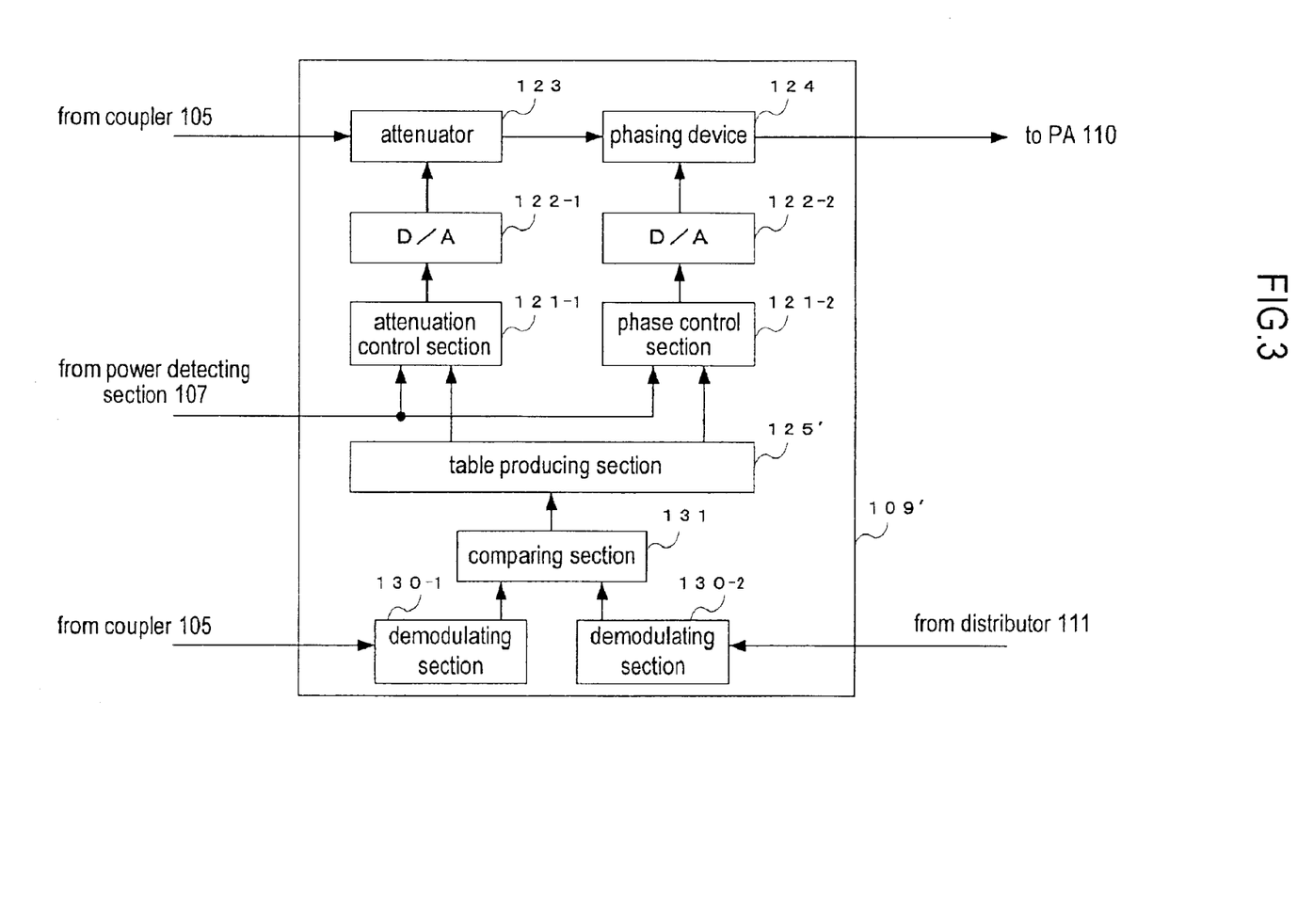
FIG. 3 is a structural block diagram of a predistorter 109'.

A structure and operation of a predistorter which performs the foregoing control will be described referring to FIG. 3, with respect to mainly a difference as compared with the predistorter of FIG. 2. FIG. 3 is a structural block diagram of another predistorter for use in the distortion compensation amplifying device according to the embodiment of the present invention. Explanation will be made by assigning the same reference signs to portions having the same structure as the predistorter of FIG. 2.

As compared with the predistorter of FIG. 2, a difference resides in that a predistorter 109' of FIG. 3 includes a demodulating section 130-1 for demodulating the multi-carrier signal outputted from the coupler 105, a demodulating section 130-2 for demodulating the multi-carrier signal fed back from the distributor 111, a comparing section 131 for comparing the demodulated contents in the demodulating sections 130-1 and 130-2 to output a comparison result to a table producing section 125', and the table producing section 125' for outputting, based on the comparison result outputted from the comparing section 131, control commands for updating the LUTs stored in the attenuation control section 121-1 and the phase control section 121-2, to the respective control sections 121-1 and 121-2.

In the predistorter 109' of FIG. 3, the demodulating section 130-1 demodulates the multi-carrier signal outputted from the coupler 105, and outputs the demodulated contents (envelope detection contents) to the comparing section 131. The demodulating section 130-2 demodulates the multi-carrier signal fed back from the distributor 111, and outputs the demodulated contents to the comparing section 131.

The comparing section 131 includes therein a memory and digital-converts the demodulated contents outputted from the demodulating sections 130-1 and 130-2 for storage in the memory. Then, the comparing section 131 multiplies the demodulated contents (envelope detected data) from the demodulating section 130-1 by an amplification factor of the PA 110, and stores it in the memory. This causes the demodulated contents (demodulated input data subjected to the multiplication) in the demodulating section 130-1 and the demodulated contents (demodulated fed-back data) in the demodulating section 130-2 to be signals of the same level.

In the comparing section 131, a time required for the input signal from entering the PA 110 for amplification to feeding back from the distributor 111 is set in advance. The comparing section 131 reads from the memory the demodulated fed-back data and the demodulated input data subjected to the multiplication which was stored earlier than the demodulated fed-back data by the set time, and compares them. With this processing, the comparing section 131 can compare the input data and the fed-back data by matching the timing.

The comparison result about the demodulated contents in the comparing section 131 is outputted to the table producing section 125'. The table producing section 125' judges an error based on the comparison result, and outputs control signals to the attenuation control section 121-1 and the phase control section 121-2 for updating the LUTs stored in the respective control sections so as to minimize the error.

The attenuation control section 121-1 and the phase control section 121-2 respectively update the LUTs based on the inputted control commands to adjust the attenuations and the phase control amounts. Thereafter, the respective control sections carry out the attenuation processing and the phase control processing of the multi-carrier signal based on the update LUTs, so that a control which can reduce an error of the demodulated contents is made possible.

In the amplifying device of FIG. 1, if the predistorter 109 is not adaptive, i.e. does not perform the adaptive predistortion, and thus no feedback of the multi-carrier signal is required, the distributor 111 is not necessary.

In accordance with the distortion compensation amplifying device according to the embodiment of the present invention, the input signals are delayed using the digital delay sections 112 in the main signal system, and the offset rotation processing and the power detection are carried out using the digital input signals in the control system, thereby to ensure the synchronization in phase between the multi-carrier signal in the main signal system and the power value signal in the control system. Therefore, the conventionally used analog delay lines become unnecessary, so that there can be provided the amplifying device which is reduced in size, weight and cost.

Now, other structures of distortion compensation amplifying devices according to the embodiments of the present invention will be described referring to figures, with respect to mainly differences as compared with the distortion compensation amplifying device of FIG. 1. Explanation will be made by assigning the same reference signs to portions having the same structure as those in FIG. 1.

Figure 4:
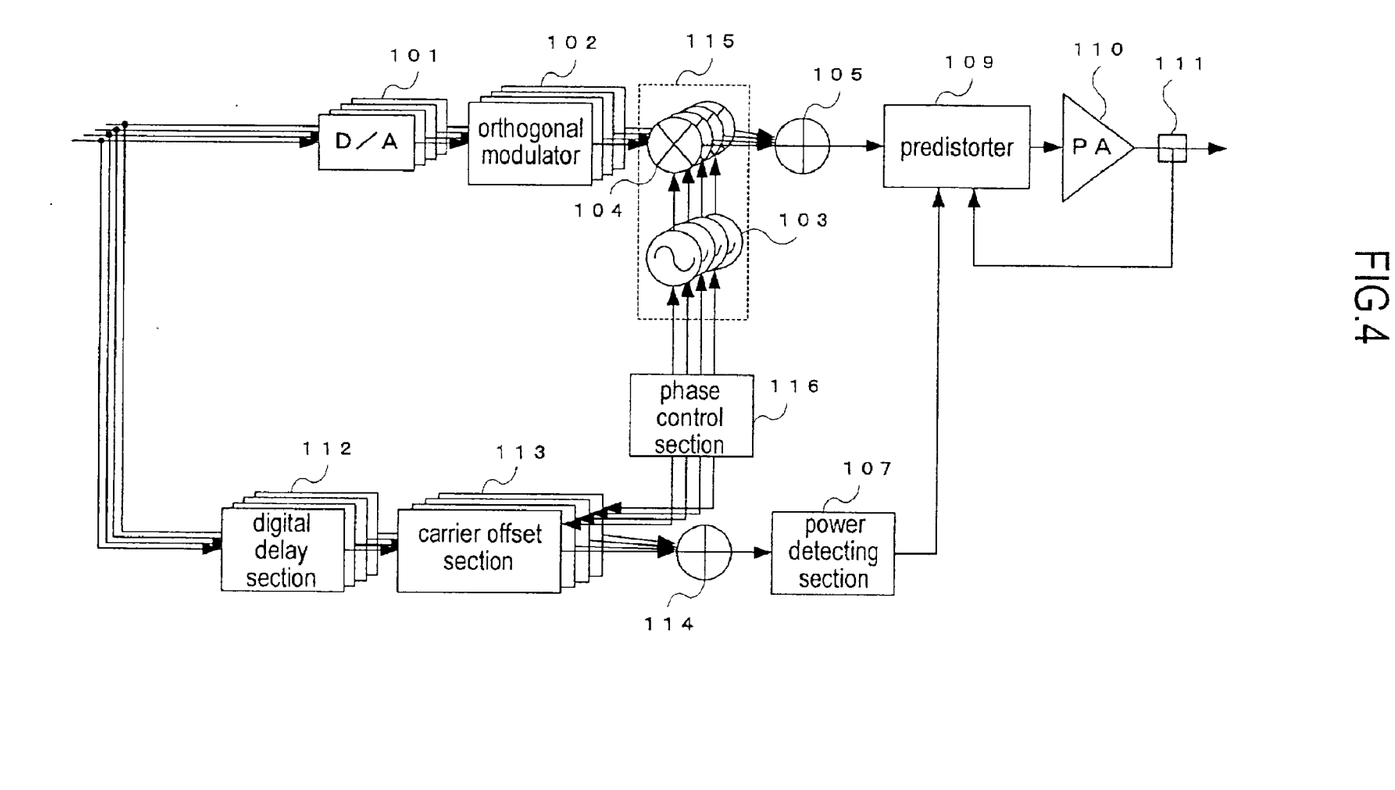
FIG. 4 is a second structural block diagram of a distortion compensation amplifying device according to an embodiment of the present invention.

FIG. 4 is a second structural block diagram of a distortion compensation amplifying device according to the embodiment of the present invention. In the amplifying device of FIG. 4, the digital delay sections 112 are provided on an input side of the carrier offset sections 113 in the control system.

The structure of the amplifying device shown in FIG. 4 is effective when a time required for the generation of the multi-carrier signal in the main signal system is greater than a time required for the power value detection in the control system. In the amplifying device of FIG. 4, the predistorter 109' shown in FIG. 3 may be used instead of the predistorter 109.

According to the amplifying device of FIG. 4, even when the time required for the generation of the multi-carrier signal is greater than the time required for the power value detection, the distortion compensation of the amplifier can be accurately performed.

Figure 5:
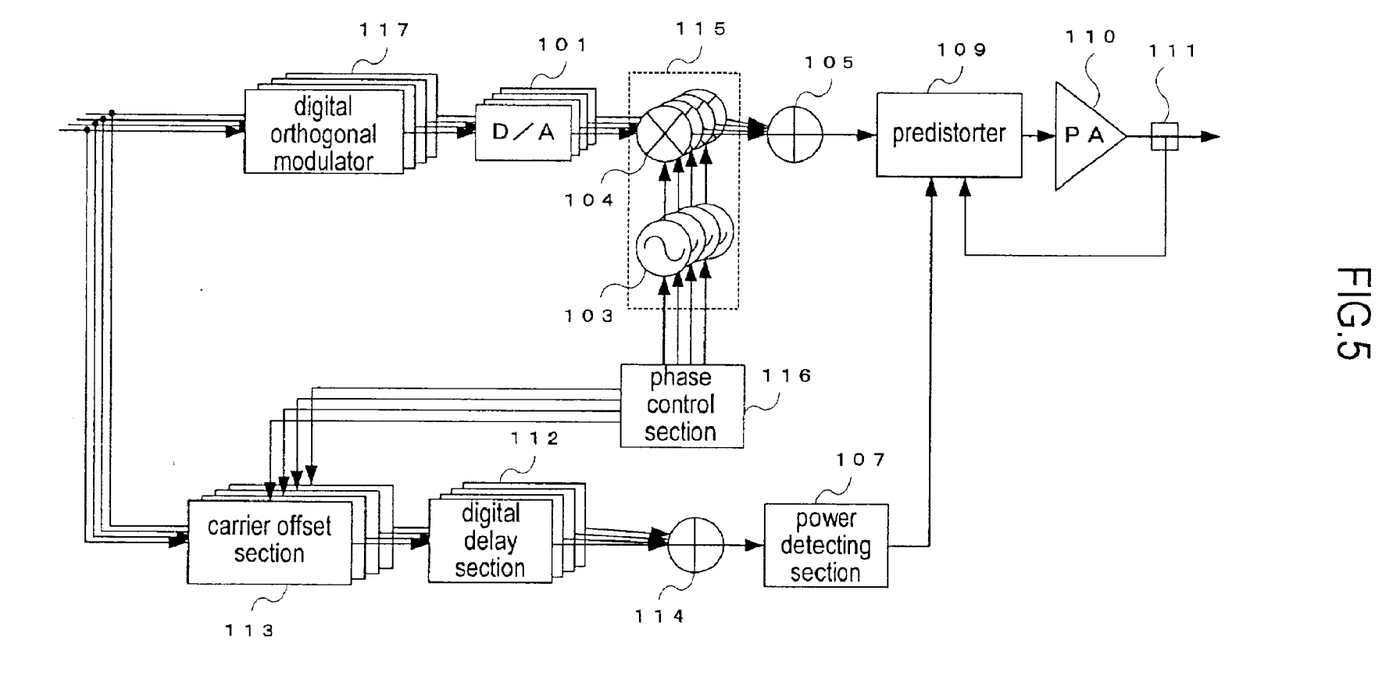
FIG. 5 is a third structural block diagram of a distortion compensation amplifying device according to an embodiment of the present invention.

FIG. 5 is a third structural block diagram of a distortion compensation amplifying device according to the embodiment of the present invention. In the amplifying device of FIG. 5, the positioning order of the digital delay sections 112 and the carrier offset sections 113 are changed in the amplifying device of FIG. 4. Even in such a structure, since the time required for the power value detection in the control system is unchanged, the amplifying device of FIG. 5 can achieve the distortion compensation of the amplifier accurately. In the amplifying device of FIG. 5, the predistorter 109' shown in FIG. 3 may be used instead of the predistorter 109.

Figure 6:
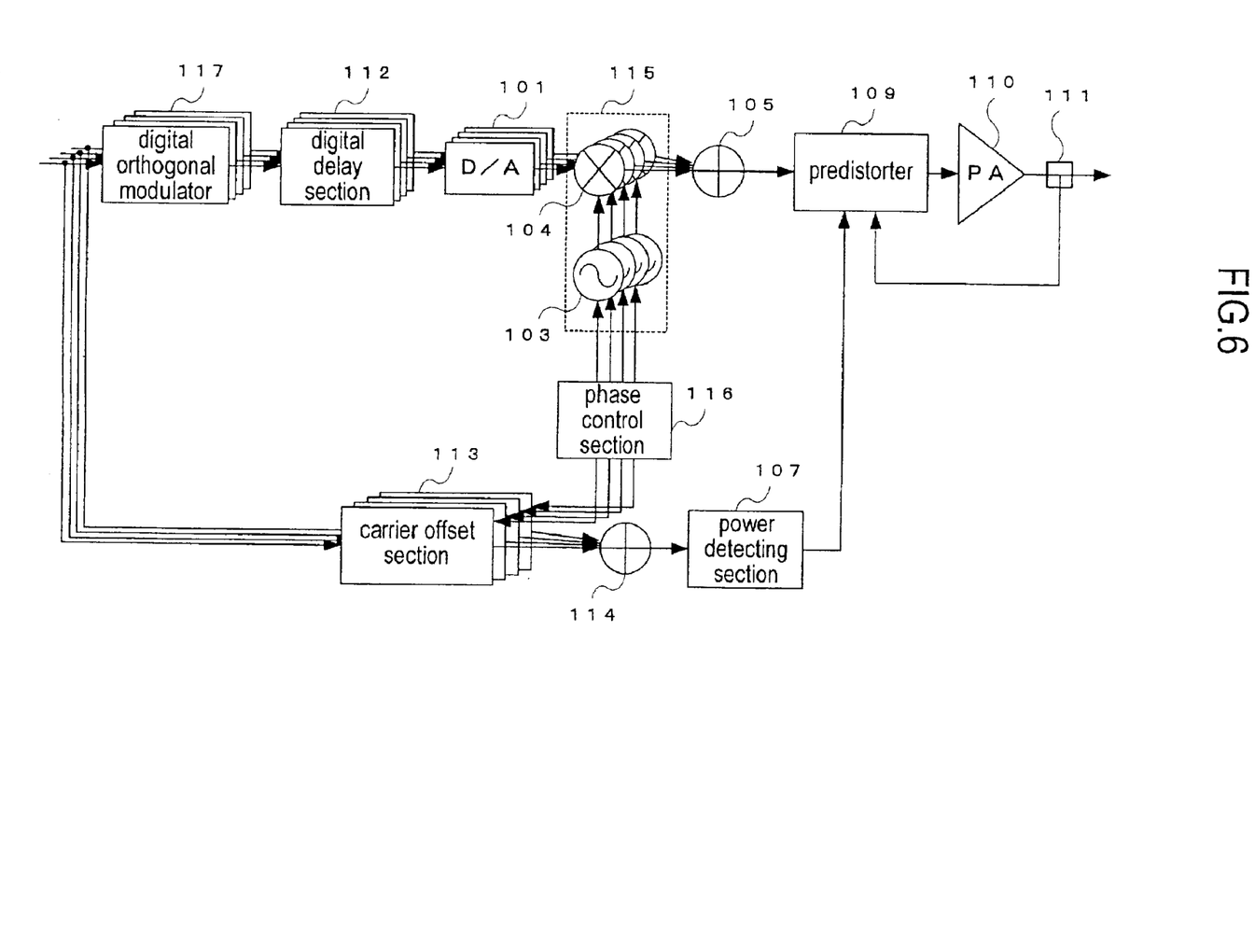
FIG. 6 is a fourth structural block diagram of a distortion compensation amplifying device according to an embodiment of the present invention.

FIG. 6 is a fourth structural block diagram of a distortion compensation amplifying device according to the embodiment of the present invention. In the amplifying device of FIG. 6, the digital orthogonal modulators 117 are provided on an input side of the digital delay sections 112, instead of the orthogonal modulators 102. The digital orthogonal modulator 117 performs orthogonal modulation of the digital input signal, and an operation thereof is the same as that of the orthogonal modulator of FIG. 1. The digital orthogonal modulator 117 is also provided per carrier. In the amplifying device of FIG. 6, the predistorter 109' shown in FIG. 3 may be used instead of the predistorter 109.

Figure 7:
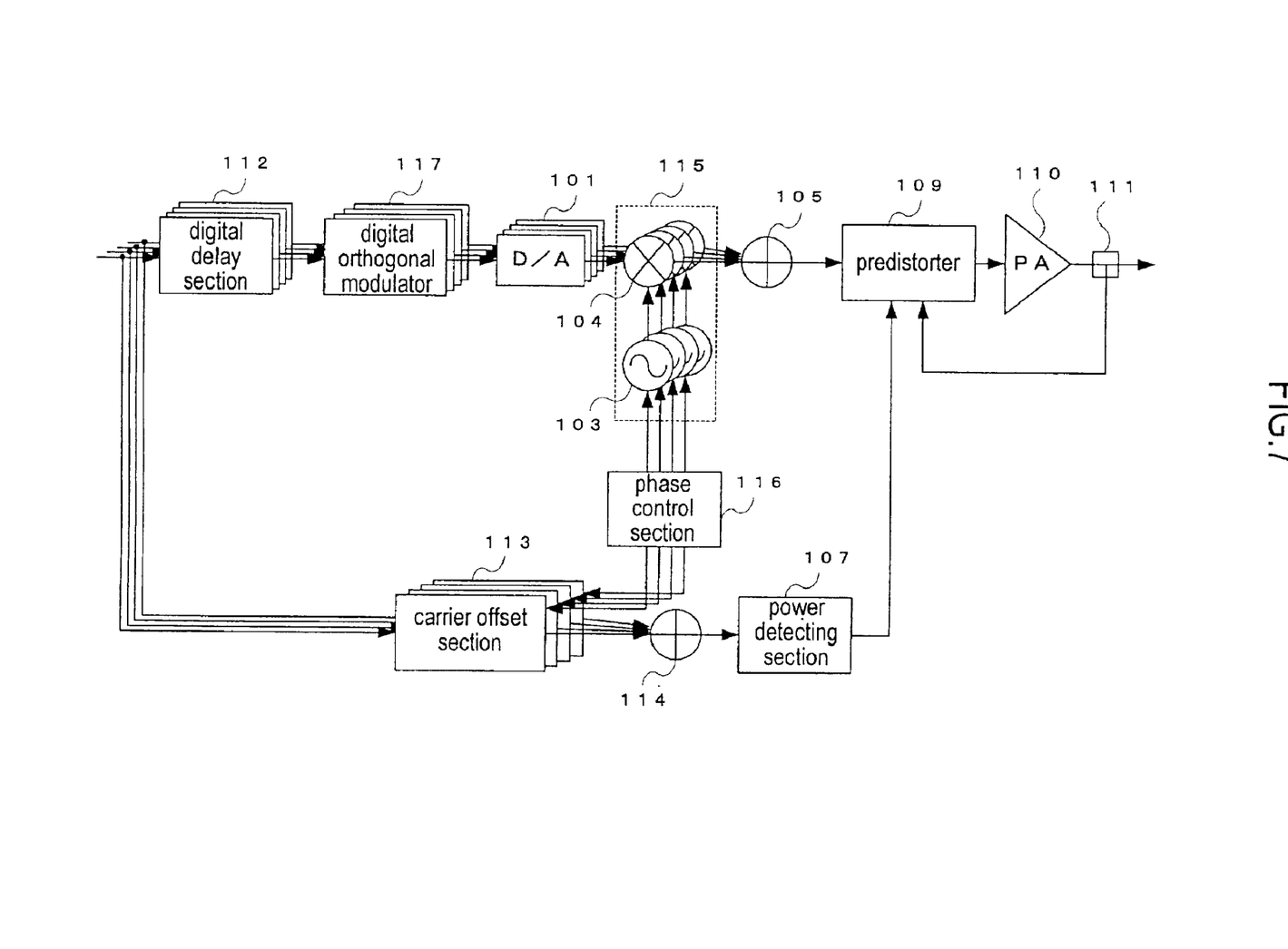
FIG. 7 is a fifth structural block diagram of a distortion compensation amplifying device according to an embodiment of the present invention.

FIG. 7 is a fifth structural block diagram of a distortion compensation amplifying device according to the embodiment of the present invention. In the amplifying device of FIG. 7, the positioning order of the digital orthogonal modulators and the digital delay sections 112 are changed in the amplifying device of FIG. 6. In the amplifying device of FIG. 7, the predistorter 109' shown in FIG. 3 may be used instead of the predistorter 109.

Figure 8:
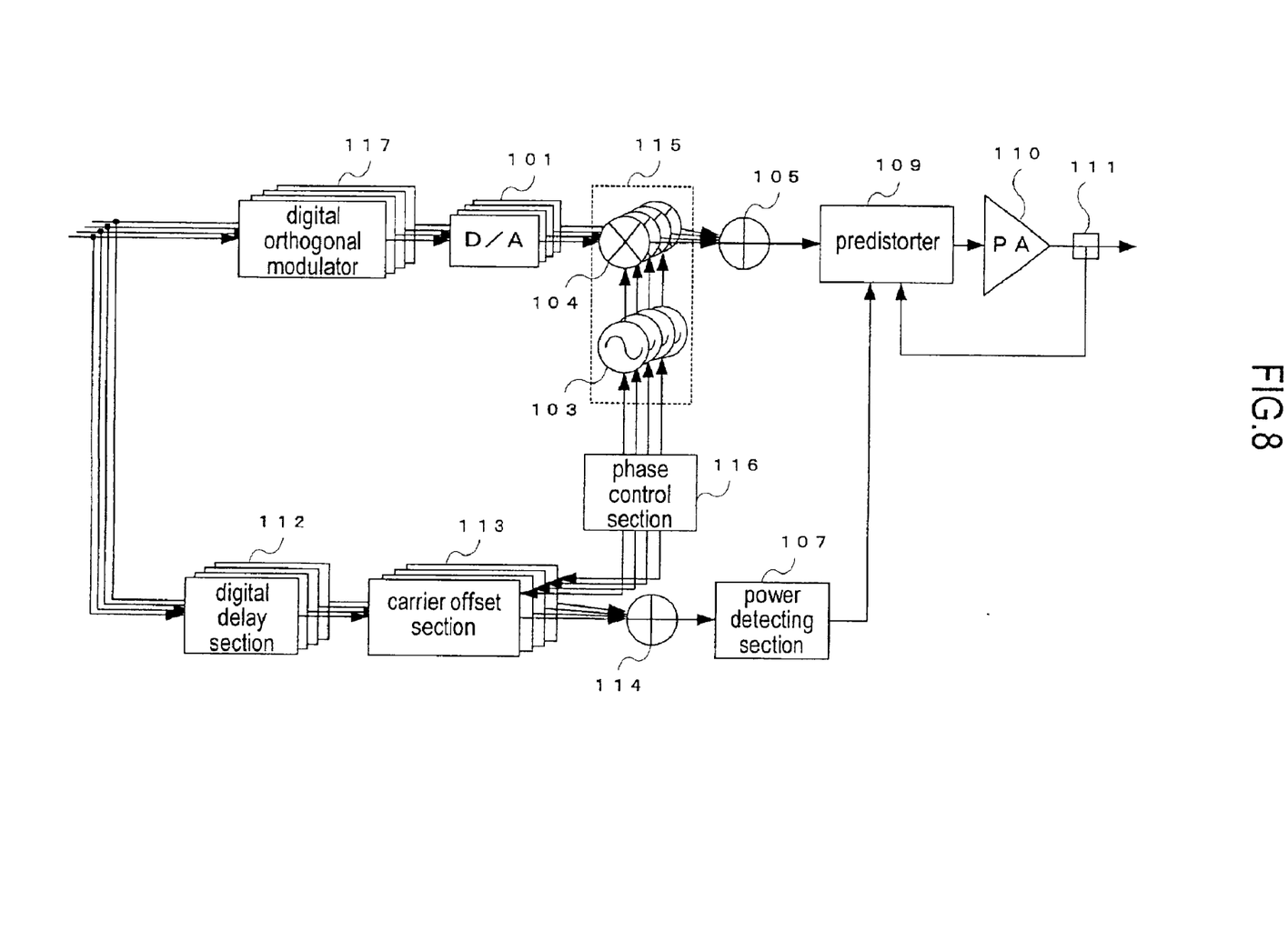
FIG. 8 is a sixth structural block diagram of a distortion compensation amplifying device according to an embodiment of the present invention.

FIG. 8 is a sixth structural block diagram of a distortion compensation amplifying device according to the embodiment of the present invention. In the amplifying device of FIG. 8, the digital delay sections 112 are provided on an input side o the carrier offset sections 113 in the amplifying device of FIG. 6.

The structure of the amplifying device shown in FIG. 8 is effective when a time required for the generation of the multi-carrier signal in the main signal system is greater than a time required for the power value detection in the control system. In the amplifying device of FIG. 8, the predistorter 109' shown in FIG. 3 may be used instead of the predistorter 109.

According to the amplifying device of FIG. 8, even when the time required for the generation of the multi-carrier signal is greater than the time required for the power value detection, the distortion compensation of the amplifier can be accurately performed.

Figure 9:
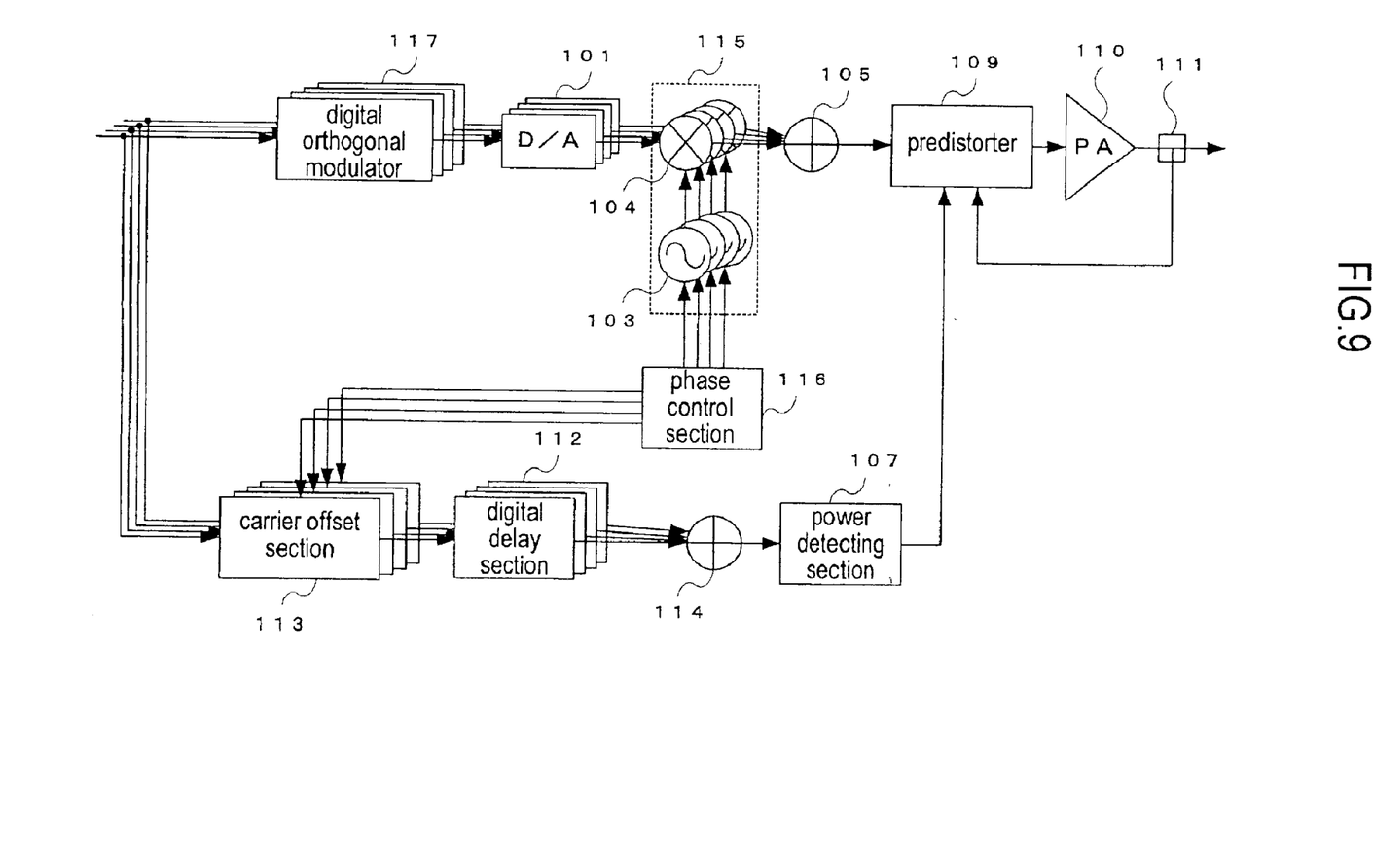
FIG. 9 is a seventh structural block diagram of a distortion compensation amplifying device according to an embodiment of the present invention.

FIG. 9 is a seventh structural block diagram of a distortion compensation amplifying device according to the embodiment of the present invention. In the amplifying device of FIG. 9, the positioning order of the digital delay sections 112 and the carrier offset sections 113 are changed in the amplifying device of FIG. 8. Even in such a structure, since the time required for the power value detection in the control system is unchanged, the amplifying device of FIG. 9 can achieve the distortion compensation of the amplifier accurately. In the amplifying device of FIG. 9, the predistorter 109' shown in FIG. 3 may be used instead of the predistorter 109.

According to the present invention, there is provided an amplifying device, wherein a digital delay section for digital-delaying an input signal per carrier for a constant time is provided in a main signal system or a control system instead of an analog delay line, phases of signals in the main signal system and the control system are controlled in a phase control section, and a distortion compensating section gives distortion compensation to a multi-carrier signal for canceling a nonlinear characteristic generated in an amplifying section, based on a power value and a portion of an output from a distributing section. Therefore, the amplifying device according to the present invention requires no analog delay lines, and thus can be provided with reduced size, weight and cost.

Further, there is also provided an amplifying device, wherein a digital delay section for digital-delaying an input signal per carrier for a constant time is provided in a main signal system or a control system instead of an analog delay line, phases of signals in the main signal system and the control system are controlled in a phase control section, and a distortion compensating section performs a control relative to a multi-carrier signal for reducing an error between the respective demodulated contents based on a power value and an output from a distributing section. Therefore, the amplifying device requires no analog delay lines, and thus can be provided with reduced size, weight and cost.

What is claimed is:

1. An amplifying device comprising:

digital delay sections each for digital-delaying an input signal per carrier for a constant time;

orthogonal modulating sections each for orthogonal-modulating the input signal per carrier;

an up-convert section for converting each of the orthogonal-converted signals to a radio frequency;

a coupling section for combining the radio frequencies of the respective carriers to produce a multi-carrier signal;

carrier offset sections each for performing offset processing corresponding to a carrier frequency difference, relative to the input signal per carrier;

an adding section for adding together the offset signals;

a phase control section for executing a control of matching phases of the signals outputted from said up-convert section and the signals inputted to said adding section;

a power detecting section for detecting a power value based on an output from said adding section;

an amplifying section for amplifying the multi-carrier signal;

a distributing section for distributing an output from said amplifying section; and a distortion compensating section for giving distortion compensation to the multi-carrier signal from said coupling section for canceling a nonlinear characteristic generated in said amplifying section, based on the power value detected in said power detecting section and an output from said distributing section.

2. An amplifying device according to claim 1, wherein the digital delay sections, digital/analog converting sections, analog orthogonal modulating sections being the orthogonal modulating sections, the up-convert section, the coupling section, the distortion compensating section, the amplifying section and the distributing section are arranged in the order named as a main signal system relative to the input signals, wherein the carrier offset sections, the adding section and the power detecting section are arranged in the order named as a control system relative to the input signals, and wherein the phase control section performs a control of matching phases of signals outputted from the up-convert section and the carrier offset sections.

3. An amplifying device according to claim 1, wherein digital/analog converting sections, analog orthogonal modulating sections being the orthogonal modulating sections, the up-convert section, the coupling section, the distortion compensating section, the amplifying section and the distributing section are arranged in the order named as a main signal system relative to the input signals, wherein the digital delay sections, the carrier offset sections, the adding section and the power detecting section are arranged in the order named as a control system relative to the input signals, and wherein the phase control section performs a control of matching phases of signals outputted from the up-convert section and the carrier offset sections.

4. An amplifying device according to claim 1, wherein digital/analog converting sections, analog orthogonal modulating sections being the orthogonal modulating sections, the up-convert section, the coupling section, the distortion compensating section, the amplifying section and the distributing section are arranged in the order named as a main signal system relative to the input signals, wherein the carrier offset sections, the digital delay sections, the adding section and the power detecting section are arranged in the order named as a control system relative to the input signals, and wherein the phase control section performs a control of matching phases of signals outputted from the up-convert section and the digital delay sections.

5. An amplifying device according to claim 1, wherein digital orthogonal modulating sections being the orthogonal modulating sections, the digital delay sections, digital/analog converting sections, the up-convert section, the coupling section, the distortion compensating section, the amplifying section and the distributing section are arranged in the order named as a main signal system relative to the input signals, wherein the carrier offset sections, the adding section and the power detecting section are arranged in the order named as a control system relative to the input signals, and wherein the phase control section performs a control of matching phases of signals outputted from the up-convert section and the carrier offset sections.

6. An amplifying device according to claim 1, wherein the digital delay sections, digital orthogonal modulating sections being the orthogonal modulating sections, digital/analog converting sections, the up-convert section, the coupling section, the distortion compensating section, the amplifying section and the distributing section are arranged in the order named as a main signal system relative to the input signals, wherein the carrier offset sections, the adding section and the power detecting section are arranged in the order named as a control system relative to the input signals, and wherein the phase control section performs a control of matching phases of signals outputted from the up-convert section and the carrier offset sections.

7. An amplifying device according to claim 1, wherein digital orthogonal modulating sections being the orthogonal modulating sections, digital/analog converting sections, the up-convert section, the coupling section, the distortion compensating section, the amplifying section and the distributing section are arranged in the order named as a main signal system relative to the input signals, wherein the digital delay sections, the carrier offset sections, the adding section and the power detecting section are arranged in the order named as a control system relative to the input signals, and wherein the phase control section performs a control of matching phases of signals outputted from the up-convert section and the carrier offset sections.

8. An amplifying device according to claim 1, wherein digital orthogonal modulating sections being the orthogonal modulating sections, digital/analog converting sections, the up-convert section, the coupling section, the distortion compensating section, the amplifying section and the distributing section are arranged in the order named as a main signal system relative to the input signals, wherein the carrier offset sections, the digital delay sections, the adding section and the power detecting section are arranged in the order named as a control system relative to the input signals, and wherein the phase control section performs a control of matching phases of signals outputted from the up-convert section and the digital delay sections.

9. A base station device in a mobile communication system, said device comprising the amplifying device according to claim 1.

10. An amplifying device comprising:

digital delay sections each for digital-delaying an input signal per carrier for a constant time;

orthogonal modulating sections each for orthogonal-modulating the input signal per carrier;

an up-convert section for converting each of the orthogonal-converted signals to a radio frequency;

a coupling section for combining the radio frequencies of the respective carriers to produce a multi-carrier signal;

carrier offset sections each for performing offset processing corresponding to a carrier frequency difference, relative to the input signal per carrier;

an adding section for adding together the offset signals;

a phase control section for executing a control of matching phases of the signals outputted from said up-convert section and the signals inputted to said adding section;

a power detecting section for detecting a power value based on an output from said adding section;

an amplifying section for amplifying the multi-carrier signal;

a distributing section for distributing an output from said amplifying section; and a distortion compensating section for demodulating the multi-carrier signal from said coupling section and an output from said distributing section, comparing the demodulated contents by matching the timing, and controlling the multi-carrier signal from said coupling section based on a comparison result so as to reduce an error between the demodulated contents relative to the power value detected in said power detecting section.

11. An amplifying device according to claim 10, wherein the digital delay sections, digital/analog converting sections, analog orthogonal modulating sections being the orthogonal modulating sections, the up-convert section, the coupling section, the distortion compensating section, the amplifying section and the distributing section are arranged in the order named as a main signal system relative to the input signals, wherein the carrier offset sections, the adding section and the power detecting section are arranged in the order named as a control system relative to the input signals, and wherein the phase control section performs a control of matching phases of signals outputted from the up-convert section and the carrier offset sections.

12. An amplifying device according to claim 10, wherein digital/analog converting sections, analog orthogonal modulating sections being the orthogonal modulating sections, the up-convert section, the coupling section, the distortion compensating section, the amplifying section and the distributing section are arranged in the order named as a main signal system relative to the input signals, wherein the digital delay sections, the carrier offset sections, the adding section and the power detecting section are arranged in the order named as a control system relative to the input signals, and wherein the phase control section performs a control of matching phases of signals outputted from the up-convert section and the carrier offset sections.

13. An amplifying device according to claim 10, wherein digital/analog converting sections, analog orthogonal modulating sections being the orthogonal modulating sections, the up-convert section, the coupling section, the distortion compensating section, the amplifying section and the distributing section are arranged in the order named as a main signal system relative to the input signals, wherein the carrier offset sections, the digital delay sections, the adding section and the power detecting section are arranged in the order named as a control system relative to the input signals, and wherein the phase control section performs a control of matching phases of signals outputted from the up-convert section and the digital delay sections.

14. An amplifying device according to claim 10, wherein digital orthogonal modulating sections being the orthogonal modulating sections, the digital delay sections, digital/analog converting sections, the up-convert section, the coupling section, the distortion compensating section, the amplifying section and the distributing section are arranged in the order named as a main signal system relative to the input signals, wherein the carrier offset sections, the adding section and the power detecting section are arranged in the order named as a control system relative to the input signals, and wherein the phase control section performs a control of matching phases of signals outputted from the up-convert section and the carrier offset sections.

15. An amplifying device according to claim 10, wherein the digital delay sections, digital orthogonal modulating sections being the orthogonal modulating sections, digital/analog converting sections, the up-convert section, the coupling section, the distortion compensating section, the amplifying section and the distributing section are arranged in the order named as a main signal system relative to the input signals, wherein the carrier offset sections, the adding section and the power detecting section are arranged in the order named as a control system relative to the input signals, and wherein the phase control section performs a control of matching phases of signals outputted from the up-convert section and the carrier offset sections.

16. An amplifying device according to claim 10, wherein digital orthogonal modulating sections being the orthogonal modulating sections, digital/analog converting sections, the up-convert section, the coupling section, the distortion compensating section, the amplifying section and the distributing section are arranged in the order named as a main signal system relative to the input signals, wherein the digital delay sections, the carrier offset sections, the adding section and the power detecting section are arranged in the order named as a control system relative to the input signals, and wherein the phase control section performs a control of matching phases of signals outputted from the up-convert section and the carrier offset sections.

17. An amplifying device according to claim 10, wherein digital orthogonal modulating sections being the orthogonal modulating sections, digital/analog converting sections, the up-convert section, the coupling section, the distortion compensating section, the amplifying section and the distributing section are arranged in the order named as a main signal system relative to the input signals, wherein the carrier offset sections, the digital delay sections, the adding section and the power detecting section are arranged in the order named as a control system relative to the input signals, and wherein the phase control section performs a control of matching phases of signals outputted from the up-convert section and the digital delay sections.

18. A base station device in a mobile communication system, said device comprising the amplifying device according to claim 10.

* * * * *